United States Patent
Sun

(10) Patent No.: US 11,367,858 B2
(45) Date of Patent: Jun. 21, 2022

(54) DISPLAY MODULE AND DISPLAY DEVICE WITH THROUGH HOLE AND TWO PHASE RETARDERS

(71) Applicant: BOE Technology Group Co., Ltd., Beijing (CN)

(72) Inventor: Yanliu Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 283 days.

(21) Appl. No.: 16/618,554

(22) PCT Filed: May 31, 2019

(86) PCT No.: PCT/CN2019/089679
§ 371 (c)(1),
(2) Date: Dec. 2, 2019

(87) PCT Pub. No.: WO2020/019870
PCT Pub. Date: Jan. 30, 2020

(65) Prior Publication Data
US 2021/0028406 A1  Jan. 28, 2021

(30) Foreign Application Priority Data
Jul. 27, 2018  (CN) .......................... 201810841674.2

(51) Int. Cl.
*H01L 51/52* (2006.01)
*H01L 27/32* (2006.01)
*G06V 40/13* (2022.01)

(52) U.S. Cl.
CPC .......... *H01L 51/5281* (2013.01); *G06V 40/13* (2022.01); *H01L 27/3276* (2013.01)

(58) Field of Classification Search
CPC ............ H01L 51/5281; H01L 27/3276; G06K 9/00013
See application file for complete search history.

(56) References Cited

U.S. PATENT DOCUMENTS

| 8,508,121 B2 | 8/2013 | Kwon et al. |
| 2006/0017862 A1 | 1/2006 | Song et al. |
| 2011/0090430 A1 | 4/2011 | Lee et al. |

(Continued)

FOREIGN PATENT DOCUMENTS

| CN | 102043283 A | 5/2011 |
| CN | 103207426 A | 7/2013 |

(Continued)

OTHER PUBLICATIONS

Chinese Office Action in corresponding 201810841674.2 dated Jun. 2, 2020.

*Primary Examiner* — Lex H Malsawma
(74) *Attorney, Agent, or Firm* — ArentFox Schiff LLP; Michael Fainberg

(57) ABSTRACT

Embodiments of the present disclosure provide a display module and display device. The display module comprises a display panel which is an organic electroluminescent display panel; a first phase retarder located on a side of an out-light surface of the display panel; a linear polarizer located on a side of first phase retarder facing away from the display panel; and a second phase retarder covering a side of the linear polarizer facing away from the display panel.

16 Claims, 8 Drawing Sheets

(56) References Cited

U.S. PATENT DOCUMENTS

| | | | |
|---|---|---|---|
| 2011/0175070 A1* | 7/2011 | Kim | H01L 51/0096 |
| | | | 257/40 |
| 2014/0192297 A1 | 7/2014 | Choi et al. | |
| 2015/0219814 A1 | 8/2015 | Qin | |
| 2016/0329527 A1 | 11/2016 | Yang et al. | |
| 2017/0307796 A1* | 10/2017 | Boone | B32B 27/06 |
| 2018/0121703 A1 | 5/2018 | Jung et al. | |
| 2018/0314873 A1 | 11/2018 | Yang et al. | |
| 2018/0337219 A1* | 11/2018 | Rhee | H01L 27/3244 |
| 2018/0357462 A1* | 12/2018 | Mackey | G06K 9/00026 |
| 2019/0006440 A1 | 1/2019 | Sun et al. | |
| 2019/0034690 A1* | 1/2019 | Jung | G02B 5/3083 |
| 2019/0172886 A1 | 6/2019 | Ma et al. | |
| 2019/0294851 A1* | 9/2019 | Chung | H01L 51/5281 |
| 2019/0354789 A1 | 11/2019 | Gu et al. | |
| 2020/0127066 A1 | 4/2020 | Zhang et al. | |

FOREIGN PATENT DOCUMENTS

| | | |
|---|---|---|
| CN | 103913887 A | 7/2014 |
| CN | 104319282 A | 1/2015 |
| CN | 107102693 A | 8/2017 |
| CN | 107103307 A | 8/2017 |
| CN | 107451518 A | 12/2017 |
| CN | 107978624 A | 5/2018 |
| CN | 108021860 A | 5/2018 |
| CN | 108242453 A | 7/2018 |

\* cited by examiner

DISPLAY MODULE AND DISPLAY DEVICE WITH THROUGH HOLE AND TWO PHASE RETARDERS

This application is a US National Stage of International Application No. PCT/CN2019/089679, filed on May 31, 2019, which claims priority to Chinese patent application No. 201810841674.2, filed with Chinese Patent Office on Jul. 27, 2018, entitled "Display Module and Display Device", which is incorporated herein by reference in its entirety.

FIELD

The present disclosure relates to the field of display technology, and particularly relates to a display module and a display device.

BACKGROUND

Nowadays, a circular polarizer is generally provided on the light outgoing side of a display screen of an electronic device, such that light transmitted out of the circular polarizer is linearly polarized light. However, polarized sunglasses currently on the market are equivalent to a linear polarizer, with an absorption axis in a horizontal (i.e. 0°) or vertical (i.e. 90°) direction. When a polarization direction of the light transmitted out of the circular polarizer is parallel to the absorption axis of the polarized sunglasses, the light transmitted out of the circular polarizer is absorbed by the polarized sunglasses, so that the human eyes cannot see the light, and thus cannot see pictures on the display screen, thereby degrading the user experience greatly.

SUMMARY

An embodiment of the present disclosure provides a display module, including:

a display panel which is an organic electroluminescent display panel;

a first phase retarder located on a side of an out-light surface of the display panel;

a linear polarizer located on a side of the first phase retarder facing away from the display panel; and a second phase retarder covering a side of the linear polarizer facing away from the display panel.

Optionally, in an embodiment of the present disclosure, at least one of the second phase retarder and the linear polarizer includes a plurality of first through holes for implementing pinhole imaging;

a display area of the display panel includes transparent areas in one-to-one correspondence with the plurality of first through holes; an orthographic projection of each transparent area on the display panel and an orthographic projection of a corresponding first through hole on the display panel have a overlapping field; and the display module further includes a light sensing detector for receiving an image of a fingerprint formed through the first through hole.

Optionally, in an embodiment of the present disclosure, the orthographic projection of the transparent area on the display panel covers the orthographic projection of the corresponding first through hole on the display panel.

Optionally, in an embodiment of the present disclosure, each of the plurality of first through holes are is a circle; and the transparent area is a circle concentric with a corresponding first through hole.

Optionally, in an embodiment of the present disclosure, the diameter d1 of the transparent area satisfies the formula: $d1=d0+2h \tan\theta$; where $d0$ represents the diameter of the first through hole, and $\theta$ represents a maximum imaging viewing angle;

in the case the second phase retarder includes first through holes, h represents a distance between a lower surface of the second phase retarder facing to the display panel and a lower surface of the display panel facing away from the second phase retarder; and in the case the linear polarizer includes first through holes, or the second phase retarder and the linear polarizer include first through holes, h represents a distance between a lower surface of the linear polarizer facing to the display panel and a lower surface of the display panel facing away from the second phase retarder.

Optionally, in an embodiment of the present disclosure, the diameter of the first through hole ranges from 6 µm to 20 µm.

Optionally, in an embodiment of the present disclosure, the first phase retarder includes second through holes in one-to-one correspondence with the first through holes; and an orthographic projection of each second through hole on the display panel and an orthographic projection of the corresponding first through hole on the display panel have a overlapping field.

Optionally, in an embodiment of the present disclosure, the orthographic projection of the second through hole on the display panel covers the orthographic projection of the corresponding first through hole on the display panel.

Optionally, in an embodiment of the present disclosure, the second through hole is a circle concentric with the corresponding first through hole.

Optionally, in an embodiment of the present disclosure, the diameter d2 of the second through hole satisfies the formula: $d2=d0+2h' \tan\theta$; where $d0$ represents the diameter of the first through hole, and $\theta$ represents a maximum imaging viewing angle;

in the case the second phase retarder includes first through holes, h' represents a distance between a lower surface of the second phase retarder facing to the display panel and a lower surface of the first phase retarder facing to the display panel; and in the case the linear polarizer includes first through holes, or the second phase retarder and the linear polarizer include first through holes, h' represents a distance between the lower surface of the first phase retarder facing to the display panel and an upper surface of the first phase retarder facing away from the display panel.

Optionally, in the embodiment of the present disclosure, the first phase retarder and the second phase retarder are both ¼λ wave plates.

Optionally, in an embodiment of the present disclosure, an included angle between a transmission axis direction of the linear polarizer and an optical axis of the second phase retarder is ±45°; and an included angle between the transmission axis direction of the linear polarizer and an optical axis of the first phase retarder is ±45°.

Optionally, in an embodiment of the present disclosure, the display panel further includes a plurality of pixel units and wires arranged in gaps between every two adjacent ones of the pixel units; and orthographic projections of the pixel units and the wires on the display panel do not overlap with orthographic projections of the transparent areas on the display panel.

Optionally, in an embodiment of the present disclosure, the light sensing detector includes a charge coupled photosensitive image sensor or a complementary metal-oxide-semiconductor photosensitive image sensor.

Optionally, in an embodiment of the present disclosure, the light sensing detector is disposed on a surface of the display panel away from light and arranged corresponding to the first through hole.

Optionally, in an embodiment of the present disclosure, one light sensing detector is provided, and the one light sensing detector corresponds to all of the first through holes, and an orthographic projection of the one light sensing detector on the display panel covers the orthographic projections of all the first through holes on the display panel; or a plurality of light sensing detectors are provided, and the plurality of light sensing detectors are in one-to-one correspondence with the first through holes, and an orthographic projection of each of the plurality of light sensing detectors on the display panel covers the orthographic projection of the corresponding first through hole on the display panel.

Correspondingly, an embodiment of the present disclosure further provides a display device, including the aforementioned display module.

BRIEF DESCRIPTION OF THE DRAWINGS

FIG. 2b is a schematic diagram of polarization states of the light corresponding to the structure shown in FIG. 2a;

FIG. 3b is a schematic diagram of polarization states of the light corresponding to the structure shown in FIG. 3a;

FIG. 4b is a schematic diagram of polarization states of the light corresponding to the structure shown in FIG. 4a;

DETAILED DESCRIPTION OF EMBODIMENTS

Figure 1:
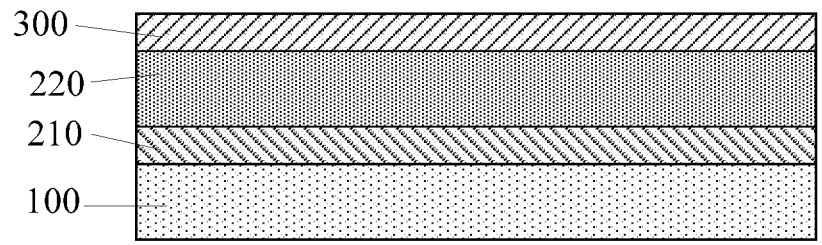
FIG. 1 is a first structural schematic diagram of a display module provided in embodiments of the present disclosure.

To make the object, technical solutions and advantages of the present disclosure more apparent, specific implementations of the display module and the display device provided in embodiments of the present disclosure are described in detail below in conjunction with the accompanying drawings. It should be understood that the embodiments described below are only used for illustrating and explaining the present disclosure, instead of limiting the present disclosure. Moreover, in the case of no conflict, the embodiments in the present application and the features in the embodiments can be combined with each other. It needs to be noted that the thicknesses and shapes of the layers of film in the drawings do not reflect the true scale of the display module, and are merely intended to illustrate the present disclosure. Furthermore, same or similar reference numerals throughout represent same or similar elements or elements having same or similar functions.

Embodiments of the present disclosure provide a display module, as shown in FIG. 1, including:

a display panel 100 which is an organic electroluminescent display panel;

a first phase retarder 210 located on a side of an out-light surface of the display panel 100;

a linear polarizer 220 located on a side of the first phase retarder 210 facing away from the display panel 100; and a second phase retarder 300 covering a side of the linear polarizer 220 facing away from the display panel 100.

For the display module provided in the embodiments of the present disclosure, the second phase retarder is arranged on the side of the linear polarizer facing away from the display panel, and since the light output from the display panel becomes linearly polarized light after passing through the first phase retarder and the linear polarizer, and the linearly polarized light is converted into circularly polarized light after passing through the second phase retarder. As the circularly polarized light can pass through the linear polarizer, when a person wears polarized sunglasses, regardless of whether an absorption axis of the polarized sunglasses is in a horizontal or vertical direction, there is always light incident to the human eyes through the polarized sunglasses, so that the observer can see a picture displayed on the display panel.

An organic light emitting diodes (OLEDs), or called organic electroluminescent diodes, have the advantages of low energy consumption, a low production cost, self-illumination, a wide viewing angle and fast response, etc. In a specific implementation, in the embodiments of the present disclosure, the display panel may be an OLED display panel. Specifically, the display panel may include a plurality of pixel units and wires arranged in gaps between every two adjacent ones of the pixel units. The pixel units have organic light emitting diodes (OLED) and pixel circuits for driving the OLEDs to emit light. The wires are used for inputting various drive signals to the pixel circuits. Further, the display panel may be a rigid display panel, for example, an underlying substrate of the display panel may be a glass substrate, a sapphire substrate, a quartz substrate, a plastic substrate, or the like. The display panel may also be a flexible display panel, for example, the underlying substrate of the display panel may be a Polyimide (PI) substrate, and is not limited herein.

In practical applications, the first phase retarder and the linear polarizer are generally used to solve the problem that the display panel reflects ambient light. Specifically, the ambient light is generally natural light, and when the ambient light passes through the linear polarizer, only the light whose vibration direction is parallel to a transmission axis of the linear polarizer can pass through the linear polarizer, and after passing through the second phase retarder, the natural light is still natural light without change of its polarization state. Therefore, the ambient light is still natural light after passing through the second phase retarder. After the ambient light passes through the linear polarizer, only half of the light can pass. Taking the output light being horizontally polarized light as an example, after the horizontally polarized light passes through the first phase retarder, the light can be converted into right-handed circularly polarized light (taking right-handed light as an example), and the right-handed circularly polarized light can be converted into left-handed circularly polarized light after being reflected by the display panel, and the left-handed circularly polarized light becomes linearly polarized light after passing through the first phase retarder, but the vibration direction of the linearly polarized light after passing through the first phase retarder is perpendicular to the transmission axis direction of the linear polarizer, so that the light reflected by the display panel cannot pass the linear polarizer, thereby solving the problem that the display panel reflects the ambient light, and improving the display effect.

Specifically, in the embodiments of the present disclosure, the aforementioned first phase retarder and second phase retarder may be ¼ λ wave plates, and may be other phase retarders, and are not limited herein. In a specific implementation, to obtain circularly polarized light, in the embodiment of the present disclosure, the transmission axis direction of the linear polarizer may be set to an angle of ±45° with respect to an optical axis of the second phase retarder, so that the polarized light passing through the linearly polarizer is converted into circularly polarized light after passing through the second phase retarder. Similarly, the transmission axis direction of the linear polarizer may also be set to an angle of ±45° with respect to an optical axis of the first phase retarder. Specifically, generally the light emitted by the display panel is approximately natural light, and after passing through the first phase retarder 210, the light is still natural light, and then after passing through the linear polarizer 220, the light is converted into linearly polarized light. As the included angle between the vibration direction of the converted linearly polarized light and the optical axis of the second phase retarder 300 can be ±45°, the light converted into the linearly polarized light can be converted into circularly polarized light after passing through the second phase retarder 300. As the circularly polarized light can be transmitted through the linearly polarizer, the output light from the display module can enter the human eyes through the polarized sunglasses.

A fingerprint is an invariant feature of the human body that is inherently unique and distinguishable from others. It consists of a series of ridges and valleys on the skin surface of a fingertip. The compositional details of these ridges and valleys determine the uniqueness of the fingerprint pattern. A display panel with a fingerprint recognition function developed therefrom has been used for personal identity verification, which increases information security of a display module. Therefore, the display module can be integrated with the fingerprint recognition function. The implementations integrated with the fingerprint recognition function of the present disclosure are described in detail below with reference to specific embodiments. It needs to be noted that the embodiments are only for better explanation of the present disclosure, but do not limit the present disclosure.

Figure 2A:
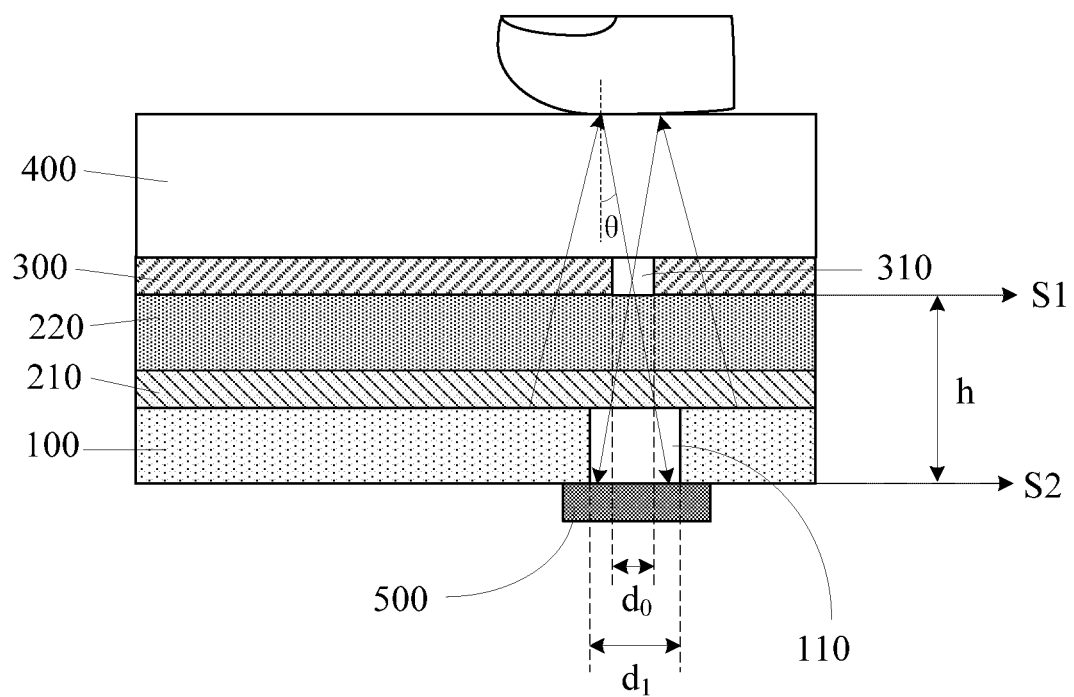
FIG. 2a is a second structural schematic diagram of a display module provided in embodiments of the present disclosure.

Generally, to protect devices, in a specific implementation, in embodiments of the present disclosure, as shown in FIG. 2a, the display module may further include a protective cover 400 arranged on a side of the second phase retarder 300 facing away from the display panel 100.

Further, in embodiments of the present disclosure, at least one of the second phase retarder and the linear polarizer includes a plurality of first through holes for implementing pinhole imaging;

a display area of the display panel includes transparent areas in one-to-one correspondence with the first through holes; an orthographic projection of each transparent area on the display panel and an orthographic projection of the corresponding first through hole on the display panel have a overlapping field; and the display module further includes a light sensing detector for receiving an image of a fingerprint formed through the first through hole.

FIG. 2a is a structural schematic diagram in which the first through hole is only provided in the second phase retarder. Specifically, in an embodiment of the present disclosure, as shown in FIG. 2a, the second phase retarder 300 may include a plurality of first through holes 310 for implementing pinhole imaging;

a display area of the display panel may include transparent areas 110 in one-to-one correspondence with the first through holes 310; an orthographic projection of each transparent area 110 on the display panel 100 and an orthographic projection of the corresponding first through hole 310 on the display panel 100 have a overlapping field; and the display module may further include a light sensing detector 500 for receiving an image of a fingerprint formed through the first through hole 310.

Further, to improve the pinhole imaging accuracy, the orthographic projection of the transparent area 110 on the display panel 100 may cover the orthographic projection of the corresponding first through hole 310 on the display panel 100.

In practical applications, the pattern of the first through hole may be any pattern capable of implementing the principle of pinhole imaging. Further, the pattern of each first through hole 310 may be set to a circular shape, the transparent area 110 may also be set to a circular shape, and the transparent area 110 is arranged concentrically with the corresponding first through hole 310. It needs to be noted that the diameter of the first through hole 310 needs to meet the requirement on the pinhole diameter in the pinhole imaging principle. For example, the diameter of the first through hole 310 may be set to 6 μm-20 μm; for example, the diameter of the first through hole 310 may be set to 6 μm, or 10 μm or 20 μm. In practical applications, the specific value of the diameter of the first through hole 310 needs to be determined through designing according to the actual application environment, and is not limited herein.

Specifically, during fingerprint recognition, light emitted by the pixel units irradiates the fingerprint of a finger, and the fingerprint reflects the incident light, and an image is formed on the light sensing detector 500 through the first through hole 310 by using the pinhole imaging principle. Then the image formed on the light sensing detector 500 is acquired, and a fingerprint image is determined according to the acquired image; and fingerprint recognition is carried out according to the determined fingerprint image to achieve the fingerprint recognition function.

Figure 2B:
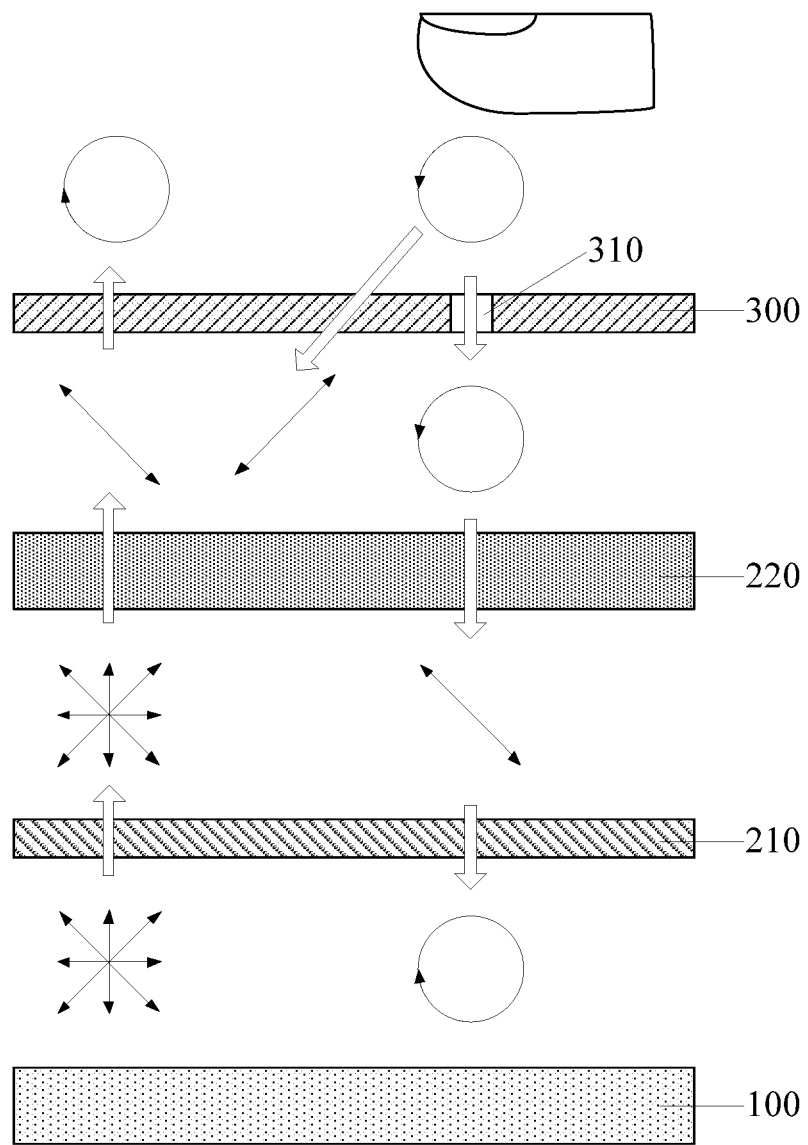

Specifically, FIG. 2b is a schematic diagram illustrating the polarization states of light corresponding to the structure shown in FIG. 2a. As shown in FIG. 2b, the light emitted by the pixel units in the display panel 100 is approximately natural light, and after passing through the first phase retarder 210, the light is still natural light, and then after passing through the linear polarizer 220, the light is converted into linearly polarized light. Using the output light being horizontally polarized light as an example, after the horizontally polarized light passes through the second phase retarder 300, the light can be converted into right-handed circularly polarized light (using right-handed circularly polarized light as an example in the figure); the right-handed circularly polarized light can be converted into left-handed circularly polarized light after being reflected by the finger; the left-handed circularly polarized light is still left-handed circularly polarized light after passing through the first through hole 310 of the second phase retarder 300; then the left-handed circularly polarized light is converted into linearly polarized light after passing through the linear polarizer 220; and the linearly polarized light becomes circularly polarized light (using right-handed polarized light as an example) after passing through the first phase retarder 210. The left-handed circularly polarized light reflected by the finger that has not passed through the first through hole 310 becomes linearly polarized light after passing through the second phase retarder 300, but the vibration direction of the linearly polarized light after passing through the second phase retarder 300 is perpendicular to the transmission axis direction of the linear polarizer 220, so that the light reflected by the finger cannot enter the light sensing detector 500 through a path other than the first through hole 310, and thus the accuracy of pinhole imaging can be improved.

In a specific implementation, in embodiments of the present disclosure, the first through hole 310 is a via hole running through the second phase retarder 300, and the plurality of first through holes 310 included in the second phase retarder 300 may be uniformly distributed. Specifically, the first through holes 310 may be uniformly distributed in the entire second phase retarder 300; or may be uniformly distributed only in a specific area of the second phase retarder 300, which is not specifically limited herein. Further, the first through holes 310 may be arranged in an array in the second phase retarder 300. In addition, a distance between centers of two adjacent first through holes may be determined through designing according to the actual application environment, and is not limited herein.

Generally, during the pinhole imaging, an image formed through the pinhole center is relatively clear, and the closer to edges, the more blurred an image is, so images formed in the light sensing detector by the fingerprint through the plurality of first through holes can be acquired. However, in the acquired images of the fingerprint formed through the plurality of first through holes, generally there are same areas of the fingerprint, that is, common imaging portions. Thus, in determining the fingerprint image, the acquired images formed through the plurality of first through holes are extracted and processed, and the extracted and processed fingerprint images are stitched, to integrate the images into a complete and clear fingerprint image for fingerprint recognition, thus improving the accuracy.

Generally, the transparent areas need to be provided at positions that are not blocked by the pixel units and the wires, otherwise the effect of the pinhole imaging can be affected, or even imaging on the light sensing detector 500 cannot be achieved. In a specific implementation, in embodiments of the present disclosure, the transparent areas may be hollowed areas in the display panel. In an actual preparation process, holes are formed in portions of the substrate corresponding to the transparent areas by cutting or etching to produce hollowed areas. Alternatively, orthographic projections of the transparent areas on the display panel do not overlap with orthographic projections of the pixel units and the wires on the display panel, thus, the substrate may be not cut, but the pixel units, the film layers, and the wires on the underlying substrate are avoided to form the transparent areas.

To further reduce the influence on the pinhole imaging effect, in a specific implementation, in embodiments of the present disclosure, as shown in FIG. 2a, the diameter d1 of the transparent area 110 may satisfy the formula: d1=d0+2h tan θ, where d0 represents the diameter of the first through hole 310, θ represents a maximum imaging viewing angle (i.e. an included angle between light closest to the edge in the light beam after passing through the first through hole in pinhole imaging and a normal line), and h represents a distance between a lower surface S1 of the second phase retarder 300 facing to the display panel 100 and a lower surface S2 of the display panel 100 on a side facing away from the second phase retarder 300. This allows all of the light passing through the first through holes 310 to be incident on the light sensing detector 500 through the corresponding transparent areas 110.

In a specific implementation, in the aforementioned display module provided in the embodiments of the present disclosure, to improve the resolution precision of fingerprint recognition by each fingerprint recognition unit, the linear polarizer 220, the first phase retarder 210, and the display panel 100 may be made as thin as possible. For example, the thickness of a circular polarizer composed of the first phase retarder 210 and the linear polarizer 220 may range from 60 µm to 100 µm. In practical applications, the thicknesses of the linear polarizer 220, the first phase retarder 210, and the display panel 100 may be determined through designing according to the actual application environment, and is not limited herein.

In a specific implementation, in embodiments of the present disclosure, as shown in FIG. 2a, the light sensing detector 500 is disposed on a surface of the display panel 100 away from light and arranged corresponding to the first through hole 310. Specifically, the light sensing detector 500 and the first through hole 310 are respectively located on two sides of the display panel 100, and the light sensing detector 500 is located at a position corresponding to the first through hole 310 to facilitate imaging on the light sensing detector 500.

In a specific implementation, one light sensing detector may be arranged in the display module, where the light sensing detector corresponds to all of the first through holes, and the orthographic projection of the light sensing detector on the display panel covers the orthographic projections of all the first through holes on the display panel; images are formed in areas of the light sensing detector through the first through holes, and then the images in the areas of the light sensing detector are processed to achieve the function of recognizing the fingerprint. Alternatively, a plurality of light sensing detectors may also be arranged in the display module, where the light sensing detectors are in one-to-one correspondence with the first through holes, and the orthographic projection of each light sensing detector on the display panel covers the orthographic projection of the corresponding first through hole on the display panel. That is, each light sensing detector is arranged corresponding to one first through hole; in addition, one light-sensing detector may also correspond to a plurality of first through holes. In practical applications, this needs to be determined through designing according to the specific application environment, and is not limited herein.

In a specific implementation, in embodiments of the present disclosure, the light sensing detector may include a charge-coupled device (CCD) photosensitive image sensor or a complementary metal-oxide-semiconductor (CMOS) photosensitive image sensor. Of course, the light sensing detector may also be any other photosensitive image sensor capable of implementing recognition of the fingerprint, which is not specifically limited herein.

Figure 3A:
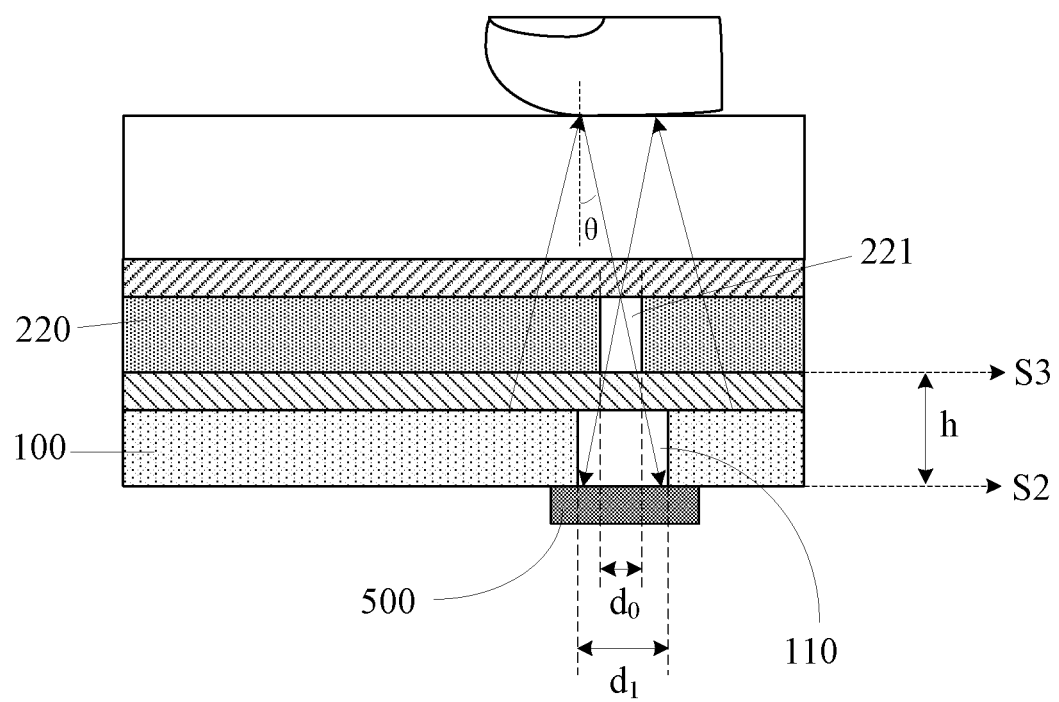
FIG. 3a is a third structural schematic diagram of a display module provided in embodiments of the present disclosure.

FIG. 3a is a structural schematic diagram in which the first through hole is only provided in the linear polarizer. The display module shown in FIG. 3a and the display module shown in FIG. 2a are similarly implemented except for the specific position of the first through hole. Only differences between the structures shown in FIG. 3a and FIG. 2a will be described below, and their similarities are not described herein.

In a specific implementation, in embodiments of the present disclosure, as shown in FIG. 3a, the linear polarizer 220 may include a plurality of first through holes 221 for implementing pinhole imaging;

a display area of the display panel may further include transparent areas 110 in one-to-one correspondence with the first through holes 221; the orthographic projection of each transparent area 110 on the display panel 100 and the orthographic projection of the corresponding first through hole 221 on the display panel 100 have a overlapping field;

and the display module may further include a light sensing detector 500 for receiving an image of a fingerprint formed through the first through hole 221.

Further, to improve the pinhole imaging accuracy, the orthographic projection of the transparent area 110 on the display panel 100 may cover the orthographic projection of the corresponding first through hole 221 on the display panel 100.

Specifically, during fingerprint recognition, light emitted by the pixel units irradiates the fingerprint of a finger, and the fingerprint reflects the incident light, and an image is formed on the light sensing detector 500 through the first through hole 221 by using the pinhole imaging principle. Then the image formed on the light sensing detector 500 is acquired, and a fingerprint image is determined according to the acquired image; and fingerprint recognition is carried out according to the determined fingerprint image to achieve the fingerprint recognition function.

Figure 3B:
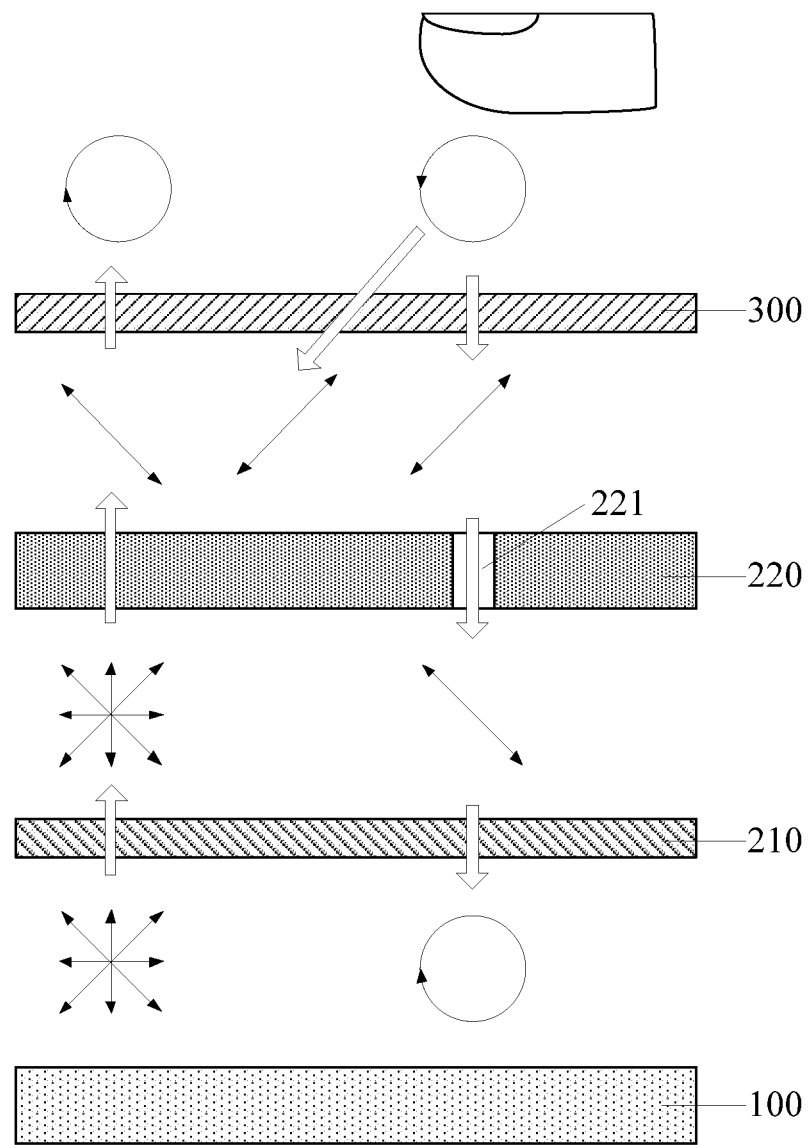

FIG. 3b is a schematic diagram of a polarization state of light corresponding to the structure shown in FIG. 3a. Differently from FIG. 2b, the left-handed circularly polarized light reflected by the finger becomes linearly polarized light after passing through the second phase retarder 300, and then after the linearly polarized light passes through the first through hole 221 on the linear polarizer 220, it is still linearly polarized light, and the linearly polarized light becomes circularly polarized light (using right-handed polarized light as an example in the figure) after passing through the first phase retarder 210. As to the linearly polarized light that has not passed through the first through hole 221 obtained after the light reflected by the finger passes through the second phase retarder 300, it cannot pass through linear polarizer 220 because its vibration direction is perpendicular to the transmission axis direction of the linear polarizer 220, so that the light reflected by the finger cannot enter the light sensing detector 500 through a path other than the first through hole 310, and thus the accuracy of pinhole imaging can be improved.

In a specific implementation, in embodiments of the present disclosure, the first through hole 221 is a via hole running through the linear polarizer 220. Moreover, the plurality of first through holes 221 included in the linear polarizer 220 may be uniformly distributed. Specifically, the first through holes 221 may be uniformly distributed in the entire linear polarizer 220; or may be uniformly distributed only in a specific area of the linear polarizer 220, which is not specifically limited herein. Further, the first through holes 221 may be arranged in an array in the linear polarizer 220. Moreover, a distance between centers of two adjacent first through holes may be determined according to the actual application environment, and is not limited herein.

To further reduce the influence on the pinhole imaging effect, in a specific implementation, in embodiments of the present disclosure, as shown in FIG. 3a, the diameter d1 of the transparent area 110 may satisfy the formula: d1=d0+2h tan θ, where d0 represents the diameter of the first through hole 221, and θ represents a maximum imaging viewing angle; (i.e. an included angle between light closest to the edge in the light beam after passing through the first through hole 221 in pinhole imaging and a normal line), and h represents a distance between a lower surface S3 of the linear polarizer 220 facing to the display panel 100 and a lower surface S2 of the display panel 100 on a side facing away from the second phase retarder 300. This allows all of the light passing through the first through holes 221 to be incident on the light sensing detector 500 through the corresponding transparent areas 110.

Figure 4A:
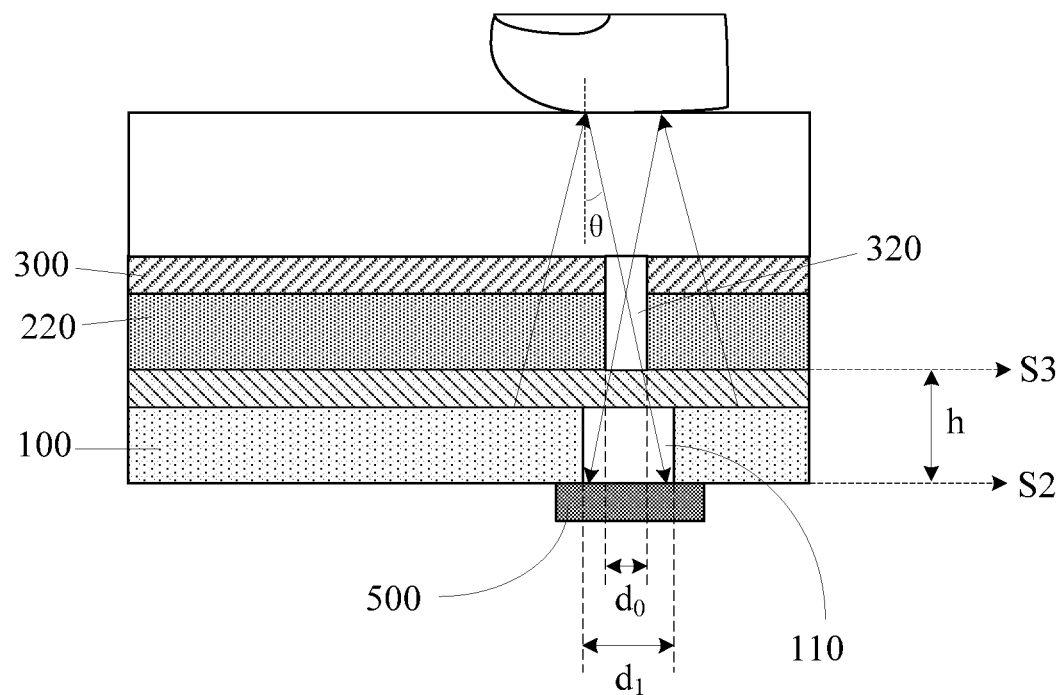
FIG. 4a is a fourth structural schematic diagram of a display module provided in embodiments of the present disclosure.

FIG. 4a is a structural schematic diagram in which the first through hole is provided in both the second phase retarder and the linear polarizer. The display module shown in FIG. 4a and the display module shown in FIG. 2a are similarly implemented except for the specific position of the first through hole. Only differences between the structures shown in FIG. 4a and FIG. 2a will be described below, and their similarities are not described herein.

In a specific implementation, in embodiments of the present disclosure, as shown in FIG. 4a, the second phase retarder 300 and the linear polarizer 220 may include a plurality of first through holes 320 for implementing pinhole imaging;

the display area of the display panel may further include transparent areas 110 in one-to-one correspondence with the first through holes 320; the orthographic projection of each transparent area 110 on the display panel 100 and the orthographic projection of the corresponding first through hole 320 on the display panel 100 have a overlapping field;

and the display module may further include a light sensing detector 500 for receiving an image of a fingerprint formed through the first through hole 320.

Further, to improve the pinhole imaging accuracy, the orthographic projection of the transparent area 110 on the display panel 100 may cover the orthographic projection of the corresponding first through hole 320 on the display panel 100.

Specifically, during fingerprint recognition, light emitted by the pixel units irradiates the fingerprint of a finger, and the fingerprint reflects the incident light, and an image is formed on the light sensing detector 500 through the first through hole 320 by using the pinhole imaging principle. Then the image formed on the light sensing detector 500 is acquired, and a fingerprint image is determined according to the acquired image; and fingerprint recognition is carried out according to the determined fingerprint image to achieve the fingerprint recognition function.

Figure 4B:
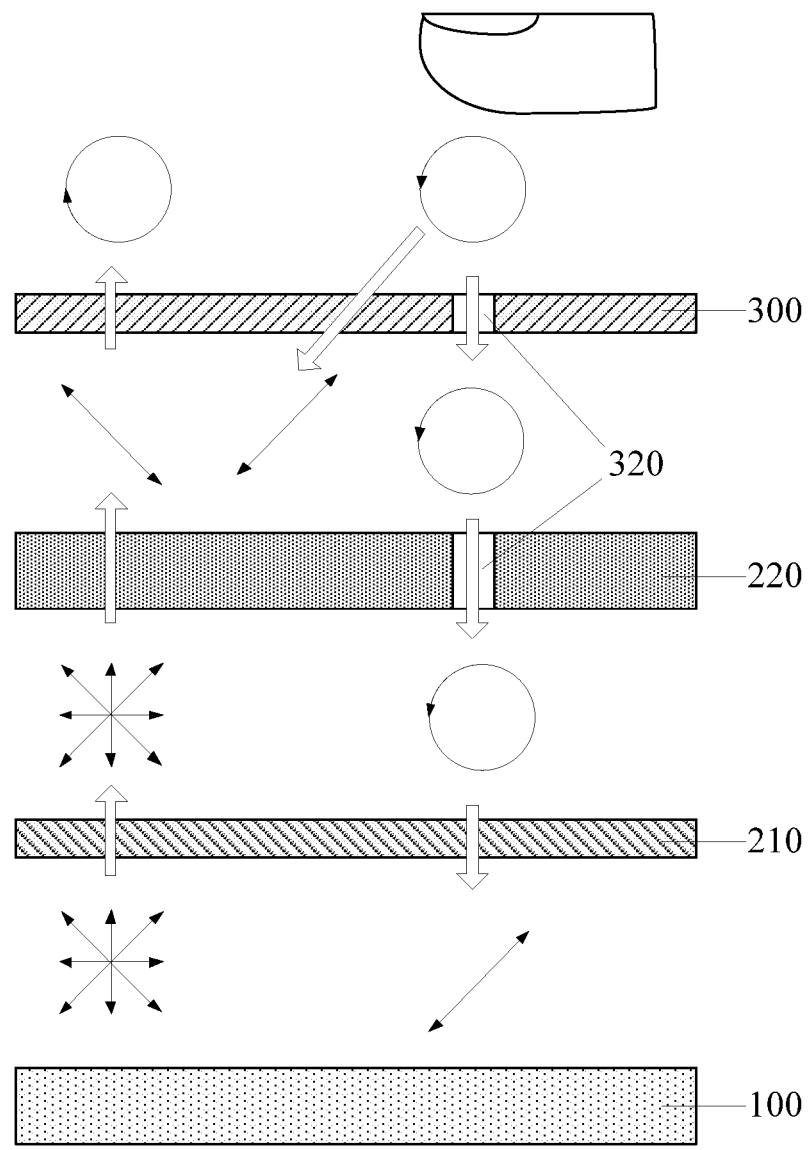

FIG. 4b is a schematic diagram illustrating polarization states of light corresponding to the structure shown in FIG. 4a. Differently from FIG. 2b, after the left-handed circularly polarized light reflected by the finger passes through the first through holes 320 in the second phase retarder 300 and the linear polarizer 220, it is still left-handed circularly polarized light, and the left-handed circularly polarized light becomes linearly polarized light after passing through the first phase retarder 210. As to the linearly polarized light obtained after the light reflected by the finger that has not passed through the first through holes 320 passes through the second phase retarder 300, it cannot pass through the linear polarizer 220 because its vibration direction is perpendicular to the transmission axis direction of the linear polarizer 220, so that the light reflected by the finger cannot enter the light sensing detector 500 through a path other than the first through holes 320, and thus the accuracy of pinhole imaging can be improved.

In a specific implementation, in embodiments of the present disclosure, the first through holes 320 are via holes running through the second phase retarder 300 and the linear polarizer 220. Moreover, the plurality of first through holes 320 included in the second phase retarder 300 and the linear polarizer 220 may be uniformly distributed. The first through holes 320 may be uniformly distributed in the entire second phase retarder 300 and linear polarizer 220; or may be uniformly distributed only in a specific area of the second phase retarder 300 and linear polarizer 220, which is not specifically limited herein. Further, the first through holes 320 may be arranged in an array in the second phase retarder 300 and the linear polarizer 220. Moreover, a distance between centers of two adjacent first through holes may be determined according to the actual application environment, and is not limited herein.

To further reduce the influence on the pinhole imaging effect, in a specific implementation, in embodiments of the present disclosure, as shown in FIG. 4a, the diameter d1 of the transparent area 110 may satisfy the formula: $d1=d0+2h \tan \theta$, where d0 represents the diameter of the first through hole 320, and θ represents a maximum imaging viewing angle; (i.e. an included angle between light closest to the edge in the light beam after passing through the first through hole 320 in pinhole imaging and a normal line), and h represents a distance between a lower surface S3 of the linear polarizer 220 facing to the display panel 100 and a lower surface S2 of the display panel 100 on a side facing away from the second phase retarder 300. This allows all of the light passing through the first through holes 320 to be incident on the light sensing detector 500 through the corresponding transparent areas 110.

Figure 5:
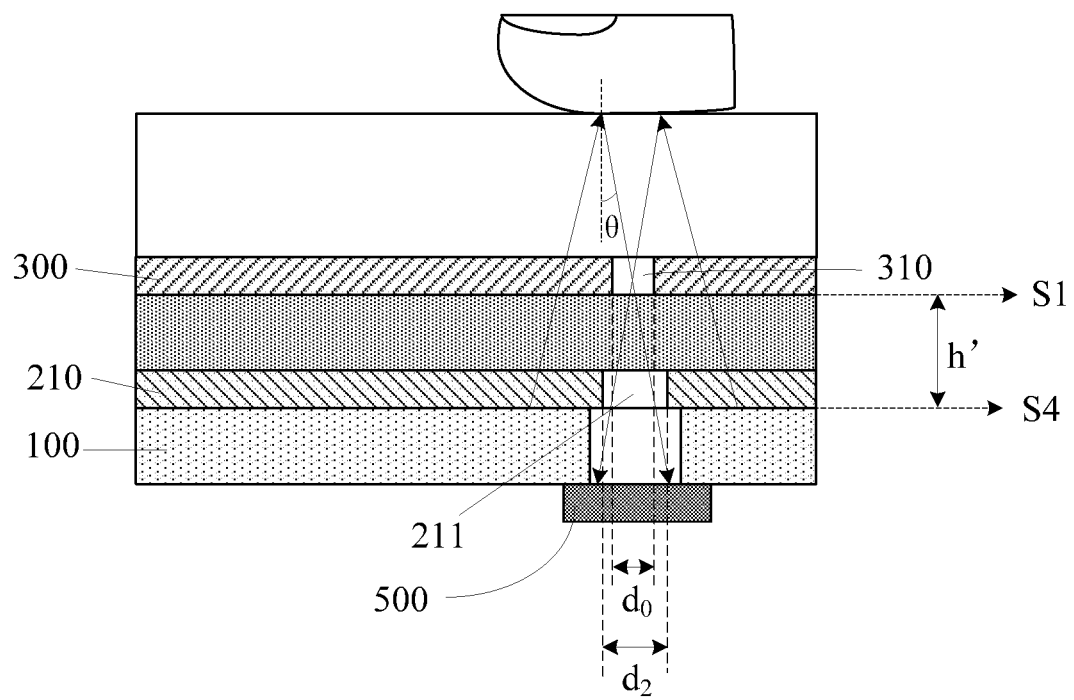
FIG. 5 is a fifth structural schematic diagram of a display screen provided in embodiments of the present disclosure.

Further, in a specific implementation, in embodiments of the present disclosure, as shown in FIG. 5, the first phase retarder 210 may include second through holes 211 in one-to-one correspondence with the first through holes 310; where an orthographic projection of each second through hole 211 on the display panel 100 and an orthographic projection of the corresponding first through hole 310 on the display panel 100 have a overlapping field.

The structure of the display module shown in FIG. 5 differs from the structure of the display module shown in FIG. 2a in that in the structure shown in FIG. 5, the first phase retarder 210 includes second through holes 211, and other portions in FIG. 5 are structurally same as those in FIG. 2a, and will not be repeated here. The light polarization states corresponding to the structure shown in FIG. 5 is similar to that in FIG. 2b, and differs in that the linearly polarized light obtained after the light reflected by the finger passes through the linear polarizer 220 is still linearly polarized light after passing through the second through holes 211.

Further, to improve the pinhole imaging accuracy, the orthographic projection of each second through hole 211 on the display panel 100 may cover the orthographic projection of the corresponding first through hole 310 on the display panel 100.

In a specific implementation, in embodiments of the present disclosure, the second through hole is a circle concentric with the corresponding first through hole.

To further reduce the influence on the pinhole imaging effect, in a specific implementation, in embodiments of the present disclosure, as shown in FIG. 5, the diameter d2 of the second through hole 211 may satisfy the formula: $d2=d0+2h' \tan \theta$, where d0 represents the diameter of the first through hole 310, θ represents a maximum imaging viewing angle, and h' represents a distance between a lower surface S1 of the second phase retarder 300 facing to the display panel 100 and a lower surface S4 of the first phase retarder 210 facing to the display panel 100. This allows all of the light passing through the first through holes 310 to be incident on the light sensing detector 500 through the corresponding second through holes 211.

Figure 6:
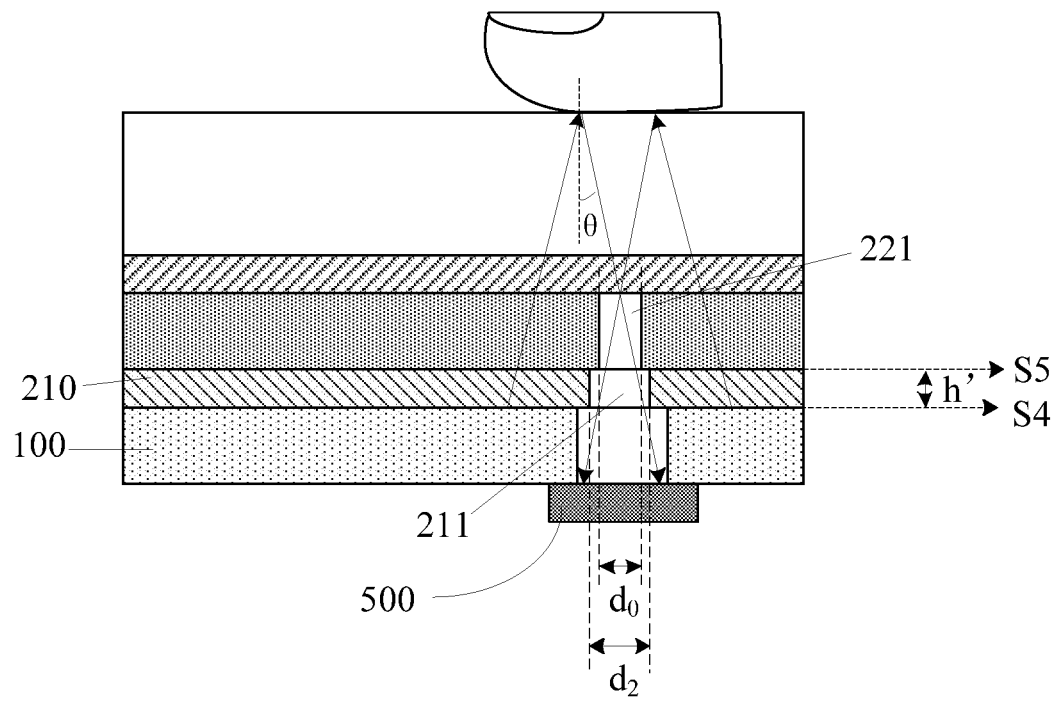
FIG. 6 is a sixth structural schematic diagram of a display screen provided in embodiments of the present disclosure.

FIG. 6 is a structural schematic diagram of another display module provided in embodiments of the present disclosure. As shown in FIG. 6, the structure shown in FIG. 6 differs from that shown in FIG. 3a in that the first phase retarder in FIG. 6 includes second through holes. Only differences between the structures shown in FIG. 6 and FIG. 3a will be described below, and their similarities are not described herein.

In a specific implementation, in embodiments of the present disclosure, as shown in FIG. 6, the first phase retarder 210 may include second through holes 211 in one-to-one correspondence with the first through holes 221; where an orthographic projection of each second through hole 211 on the display panel 100 and an orthographic projection of the corresponding first through hole 221 on the display panel 100 have a overlapping field. Further, to improve the pinhole imaging accuracy, the orthographic projection of each second through hole 211 on the display panel 100 may cover the orthographic projection of the corresponding first through hole 221 on the display panel 100.

The light polarization states corresponding to the structure shown in FIG. 6 is similar to that in FIG. 3b, and differs in that the linearly polarized light obtained after the light reflected by the finger passes through the linear polarizer 220 is still linearly polarized light after passing through the second through holes 211.

In a specific implementation, in embodiments of the present disclosure, the second through hole is a circle concentric with the corresponding first through hole. To further reduce the influence on the pinhole imaging effect, in a specific implementation, in embodiments of the present disclosure, as shown in FIG. 6, the diameter d2 of the second through hole 211 may satisfy the formula: $d2=d0+2h' \tan \theta$, where d0 represents the diameter of the first through hole 221, θ represents a maximum imaging viewing angle, and h' represents a distance between a lower surface S4 of the first phase retarder 210 facing to the display panel 100 and an upper surface S5 of the first phase retarder 210 facing away from the display panel 100; that is, h' represents the thickness of the first phase retarder 210. This allows all of the light passing through the first through holes 221 to be incident on the light sensing detector 500 through the corresponding second through holes 211.

Figure 7:
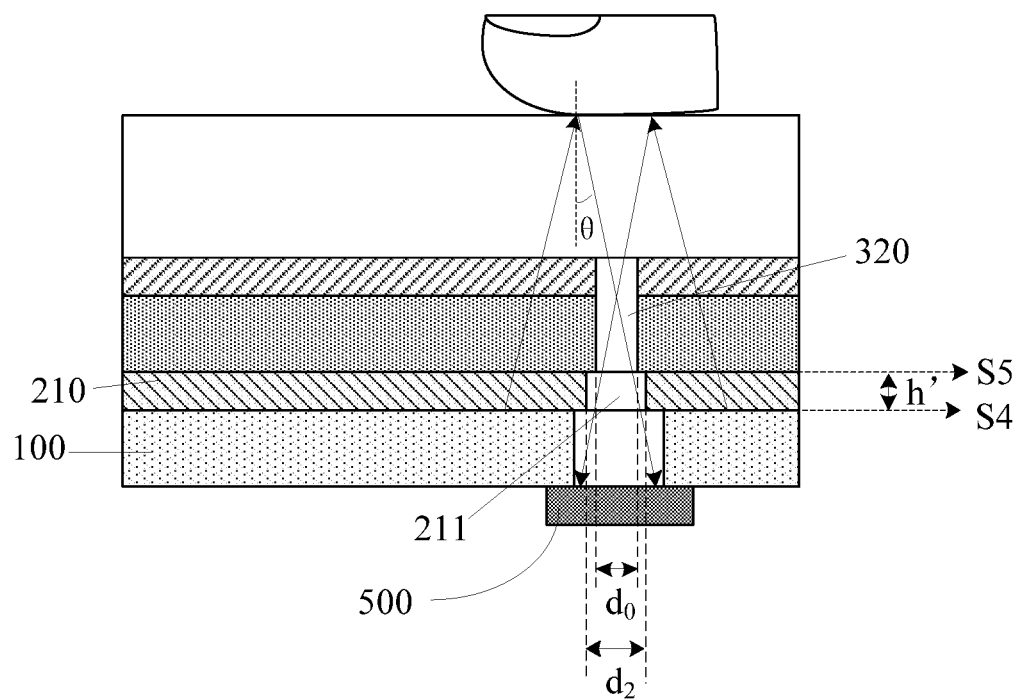
FIG. 7 is a seventh structural schematic diagram of a display screen provided in embodiments of the present disclosure.

FIG. 7 is a structural schematic diagram of another display module provided in an embodiment of the present disclosure. As shown in FIG. 7, the structure shown in FIG. 7 differs from that shown in FIG. 4a in that the first phase retarder in FIG. 7 includes second through holes. Only differences between the structures shown in FIG. 7 and FIG. 4a will be described below, and their similarities are not described herein.

In a specific implementation, in embodiments of the present disclosure, as shown in FIG. 7, the first phase retarder 210 may include second through holes 211 in one-to-one correspondence with the first through holes 320; where an orthographic projection of each second through hole 211 on the display panel 100 and an orthographic projection of the corresponding first through hole 320 on the display panel 100 have a overlapping field. Further, to improve the pinhole imaging accuracy, the orthographic projection of each second through hole 211 on the display panel 100 may cover the orthographic projection of the corresponding first through hole 320 on the display panel 100.

The light polarization states corresponding to the structure shown in FIG. 7 differs from that in FIG. 4b in that the circularly polarized light obtained after the light reflected by the finger passes through the linear polarizer 220 is still circularly polarized light after passing through the second through holes 211.

In a specific implementation, in embodiments of the present disclosure, the second through hole is a circle concentric with the corresponding first through hole. To further reduce the influence on the pinhole imaging effect, in a specific implementation, in embodiments of the present disclosure, as shown in FIG. 7, the diameter d2 of the second through hole 211 may satisfy the formula: $d2=d0+2h' \tan \theta$, where d0 represents the diameter of the first through hole 320, θ represents a maximum imaging viewing angle, and h' represents a distance between a lower surface S4 of the first phase retarder 210 facing to the display panel 100 and an upper surface S5 of the first phase retarder 210 facing away from the display panel 100; that is, h' represents the thickness of the first phase retarder 210. This allows all of the light passing through the first through holes 320 to be incident on the light sensing detector 500 through the corresponding second through holes 211.

Based on the same disclosed concept, an embodiment of the present disclosure further provides a display device, including any of the aforementioned display modules provided in the embodiments of the present disclosure. The problem solving principle of the display device is similar to that of the foregoing display module. For the implementations of the display device, reference may be made to the embodiments of the foregoing display module, and the repeated description is omitted.

In specific implementations, the display device provided in the embodiment of the present disclosure may be a mobile phone, a tablet computer, a television, a display, a notebook computer, a digital photo frame, a navigator, or any other product or component with a display function. Other indispensable components of the display device are present as understood by those skilled in the art, and are not described herein, nor should they be construed as limiting the present disclosure.

For the display module and display device provided in embodiments of the present disclosure, the second phase retarder is arranged on the side of the linear polarizer facing away from the display panel, and as output light from the display panel becomes linearly polarized light after passing through the first phase retarder and the linear polarizer, and the linearly polarized light is converted into circularly polarized light after passing through the second phase retarder, thus, when a person wears polarized sunglasses, regardless of whether the absorption axis of the polarized sunglasses is in a horizontal or vertical direction, there is always light incident to the human eyes through the polarized sunglasses, so that the observer can see a picture displayed on the display panel.

Apparently, those skilled in the art can make changes and modifications to the embodiments of the present disclosure without departing from the spirit and scope of the present disclosure. Thus, the present disclosure is also intended to encompass these changes and modifications if such changes and modifications of the present disclosure are within the scope of the claims of the present disclosure and equivalents thereof.

The invention claimed is:

1. A display module, comprising:
   a display panel which is an organic electroluminescent display panel;
   a first phase retarder located on a side of an out-light surface of the display panel;
   a linear polarizer located on a side of the first phase retarder facing away from the display panel; and
   a second phase retarder covering a side of the linear polarizer facing away from the display panel;
   wherein at least one of the second phase retarder and the linear polarizer comprises a plurality of first through holes for implementing pinhole imaging;
   a display area of the display panel comprises transparent areas in one-to-one correspondence with the plurality of first through holes; an orthographic projection of each transparent area on the display panel and an orthographic projection of a corresponding first through hole on the display panel have an overlapping field; and
   the display module further comprises a light sensing detector for receiving an image of a fingerprint formed through the corresponding first through hole.

2. The display module of claim 1, wherein the orthographic projection of the each transparent area on the display panel covers the orthographic projection of the corresponding first through hole on the display panel.

3. The display module of claim 1, wherein each of the plurality of first through holes are in a circle; and the each transparent area is a circle concentric with the corresponding first through hole.

4. The display module of claim 3, wherein a diameter $d_1$ of the each transparent area satisfies a formula: $d_1=d_0+2h \tan \theta$; wherein $d_0$ represents a diameter of the corresponding first through hole, and θ represents a maximum imaging viewing angle;
   in a case the second phase retarder comprises the plurality of first through holes, h represents a distance between a lower surface of the second phase retarder facing to the display panel and a lower surface of the display panel facing away from the second phase retarder; and
   in a case the linear polarizer includes the plurality of first through holes, or the second phase retarder and the linear polarizer include the plurality of first through holes, h represents a distance between a lower surface of the linear polarizer facing to the display panel and a lower surface of the display panel facing away from the second phase retarder.

5. The display module of claim 1, wherein a diameter of the corresponding first through hole ranges from 6 μm to 20 μm.

6. The display module of claim 1, wherein the first phase retarder comprises second through holes in one-to-one correspondence with the plurality of first through holes; and
   an orthographic projection of each second through hole on the display panel and the orthographic projection of the corresponding first through hole on the display panel have an overlapping field.

7. The display module of claim 6, wherein the orthographic projection of the second through hole on the display panel covers the orthographic projection of the corresponding first through hole on the display panel.

8. The display module of claim 6, wherein the each second through hole is a circle concentric with the corresponding first through hole.

9. The display module of claim 8, wherein a diameter $d_2$ of the each second through hole satisfies a formula: $d_2=d_0+2h'\tan\theta$; wherein $d_0$ represents a diameter of the corresponding first through hole, and $\theta$ represents a maximum imaging viewing angle;

in a case the second phase retarder comprises the plurality of first through holes, h' represents a distance between a lower surface of the second phase retarder facing to the display panel and a lower surface of the first phase retarder facing to the display panel; and in a case the linear polarizer includes the plurality of first through holes, or the second phase retarder and the linear polarizer include the plurality of first through holes, h' represents a distance between the lower surface of the first phase retarder facing to the display panel and an upper surface of the first phase retarder facing away from the display panel.

10. The display module of claim 1, wherein the first phase retarder and the second phase retarder are both ¼λ wave plates.

11. The display module of claim 10, wherein an included angle between a transmission axis direction of the linear polarizer and an optical axis of the second phase retarder is ±45°; and an included angle between the transmission axis direction of the linear polarizer and an optical axis of the first phase retarder is ±45°.

12. The display module of claim 1, wherein the display panel further comprises a plurality of pixel units and wires arranged in gaps between every two adjacent ones of the pixel units; and orthographic projections of the pixel units and the wires on the display panel do not overlap with orthographic projections of the transparent areas on the display panel.

13. The display module of claim 1, wherein the light sensing detector comprises a charge coupled photosensitive image sensor or a complementary metal-oxide-semiconductor photosensitive image sensor.

14. The display module of claim 1, wherein the light sensing detector is disposed on a surface of the display panel away from light.

15. The display module of claim 14, wherein one light sensing detector is provided, and the one light sensing detector corresponds to all of the plurality of first through holes, and an orthographic projection of the one light sensing detector on the display panel covers orthographic projections of all of the plurality of first through holes on the display panel; or a plurality of light sensing detectors are provided, and the plurality of light sensing detectors are in one-to-one correspondence with the plurality of first through holes, and an orthographic projection of each of the plurality of light sensing detectors on the display panel covers the orthographic projection of the corresponding first through hole on the display panel.

16. A display device, comprising the display module of claim 1.

* * * * *